United States Patent [19]
Carbou

[11] Patent Number: 5,216,380
[45] Date of Patent: Jun. 1, 1993

[54] PERFORMANCE OPERATIONAL AMPLIFIER AND METHOD OF AMPLIFICATION

[75] Inventor: Pierre Carbou, Tourrettes Sur Loup, France

[73] Assignee: Texas Instruments Incorporated, Dallas, Tex.

[21] Appl. No.: 769,906

[22] Filed: Oct. 1, 1991

[30] Foreign Application Priority Data

Oct. 5, 1990 [FR] France ................... 90 12329

[51] Int. Cl.$^5$ ............................................ H03F 3/45
[52] U.S. Cl. ................................. 330/253; 330/255; 330/258; 330/311; 330/261
[58] Field of Search ............... 330/253, 255, 258, 311, 330/261

[56] References Cited

U.S. PATENT DOCUMENTS

| 4,667,165 | 5/1987 | De Weck | 330/258 X |
| 4,963,834 | 10/1990 | Yukawa | 330/253 |
| 5,015,966 | 5/1991 | McIntyre | 330/258 X |

FOREIGN PATENT DOCUMENTS

325299 7/1989 European Pat. Off. .

OTHER PUBLICATIONS

De La Plaza et al., "Power-Supply Rejection in Differential Switched-Capacitor Filters", *IEEE Journal of Solid-State Circuits*, vol. SC-19, No. 6 Dec. 1984, pp. 912–918.

Rebeschini et al., "A 16-b 160-KHz CMOS Aid Converter Using Sigma-Delta Modulation", *IEEE Journal of Solid-State Circuits*, vol. 25, No. 2, Apr., 1990, pp. 431–440.

Babanezhad et al., "A Programmable Gain/Loss Circuit", *IEEE Journal of Solid-State Circuits*, vol. SC-22, No. 6 Dec. 1987, pp. 1082–1090.

Wurcer et al., "A Programmable Instrumentation Amplifier for 12-Bit Resolution Systems", *IEEE Journal of Solid-State Circuits*, vol. SC-17, No. 6, Dec. 1982 pp. 1102–1111.

*Primary Examiner*—James B. Mullins
*Attorney, Agent, or Firm*—William E. Hiller; Jay M. Cantor; Richard Donaldson

[57] ABSTRACT

An operational amplifier (10) is provided which includes a differential input stage (18) for receiving differential signals. A differential loop (30, 64), (86) amplifies said differential signals. The amplified differential signals are output on a pair differential output terminals (80, 84). A common mode loop (54), (30, 64) maintains the mean voltage of the amplified differential signals at a preselected value.

22 Claims, 4 Drawing Sheets

PERFORMANCE OPERATIONAL AMPLIFIER AND METHOD OF AMPLIFICATION

TECHNICAL FIELD OF THE INVENTION

The present invention relates in general to analog circuitry and more particularly to an operational amplifier and method of amplification.

BACKGROUND OF THE INVENTION

Oversampling conversion techniques allow for a reduction in the amount of analog circuitry required in analog-to-digital and digital-to-analog converters by shifting most of the digital processing functions into the digital domain. Despite the use of oversampling conversion techniques, however, the need for analog circuitry is not completely eliminated. Those analog elements still necessary for the implementation of oversampling conversion, such as operational amplifiers, must meet stringent performance requirements, especially in light of the high sampling frequency required. In addition to meeting the stringent performance requirements necessary for oversampling conversion, these analog elements must be compatible with the technology used to fabricate the associated digital integrated circuits such that both the analog and digital functions can be integrated into a single high-density chip. For example, if complementary metal oxide semiconductor (CMOS) digital circuitry is being used, the associated analog circuit elements must be fabricated using CMOS technology or CMOS compatible technology.

Complementary metal oxide semiconductor (CMOS) oversampled converters typically include continuous parts, such as RC anti-aliasing and smoothing filters, directly connected to switched capacitors being sampled at high-frequency, typically in the range of 1–10 MHz. Currently available CMOS converters implement CMOS operational amplifiers for switched capacitor filters which are generally based on single-stage transconductance amplifier structures. While single-stage transconductance operational amplifier structures have speed characteristics suitable for oversampled converters, these structures present a very high output impedance such that they are not well adapted to driving resistive loads. Further, the output stages of currently available CMOS amplifiers typically consist of several transistors connected in series, a structure which limits the available output voltage swing. A consequence of reduced output voltage swing is decreased output linearity and signal-to-noise ratio performance. Finally, available amplifiers generally using continuous RC filters are not suited for use with high-frequency sampled switched capacitor circuits.

Thus, a need has arisen for a CMOS operational amplifier adapted to the performance required for oversampled converters. Specifically, the need has arisen for a high-speed operational amplifier having high output linearity, improved signal to noise ratio performance at the output, and having a reduced output impedance capable of driving resistive loads.

SUMMARY OF THE INVENTION

According to the invention, an improved operational amplifier is provided. A differential signal input stage receives differential signals which are amplified by a differential loop. The amplified differential signals are provided at a plurality of output terminals. A common mode loop maintains the mean voltage of the amplified differential signals at the output terminals at a preselected value.

According to other aspects of the present invention, the differential loop comprises a first gain stage coupled to the input stage, a second gain stage coupled to the first gain stage and circuitry coupled to the output terminals and the second gain stage for dynamically controlling the output bias current from the second gain stage. According to further aspects of the invention, the common mode loop includes the first gain stage, the second gain stage and a common mode input stage coupling the output terminals and the first gain stage.

The present invention has significant advantages over prior CMOS operational amplifiers. The present invention has the speed necessary for use in oversampled analog to digital and digital to analog converters. Further, the reduced output impedance allows the operational amplifier of the present invention to drive both resistive and capacitive loads. Additionally, the operational amplifier of the present invention avoids the slew rate mode during switching transients. Finally, the present invention provides both a switchable power down mode and an unlockable common mode control loop at power up.

BRIEF DESCRIPTION OF THE DRAWINGS

Other aspects of the invention and their advantages will be discerned when one refers to the following detailed description as taken in conjunction with the drawings, in which.

DETAILED DESCRIPTION OF THE INVENTION

Figure 1:
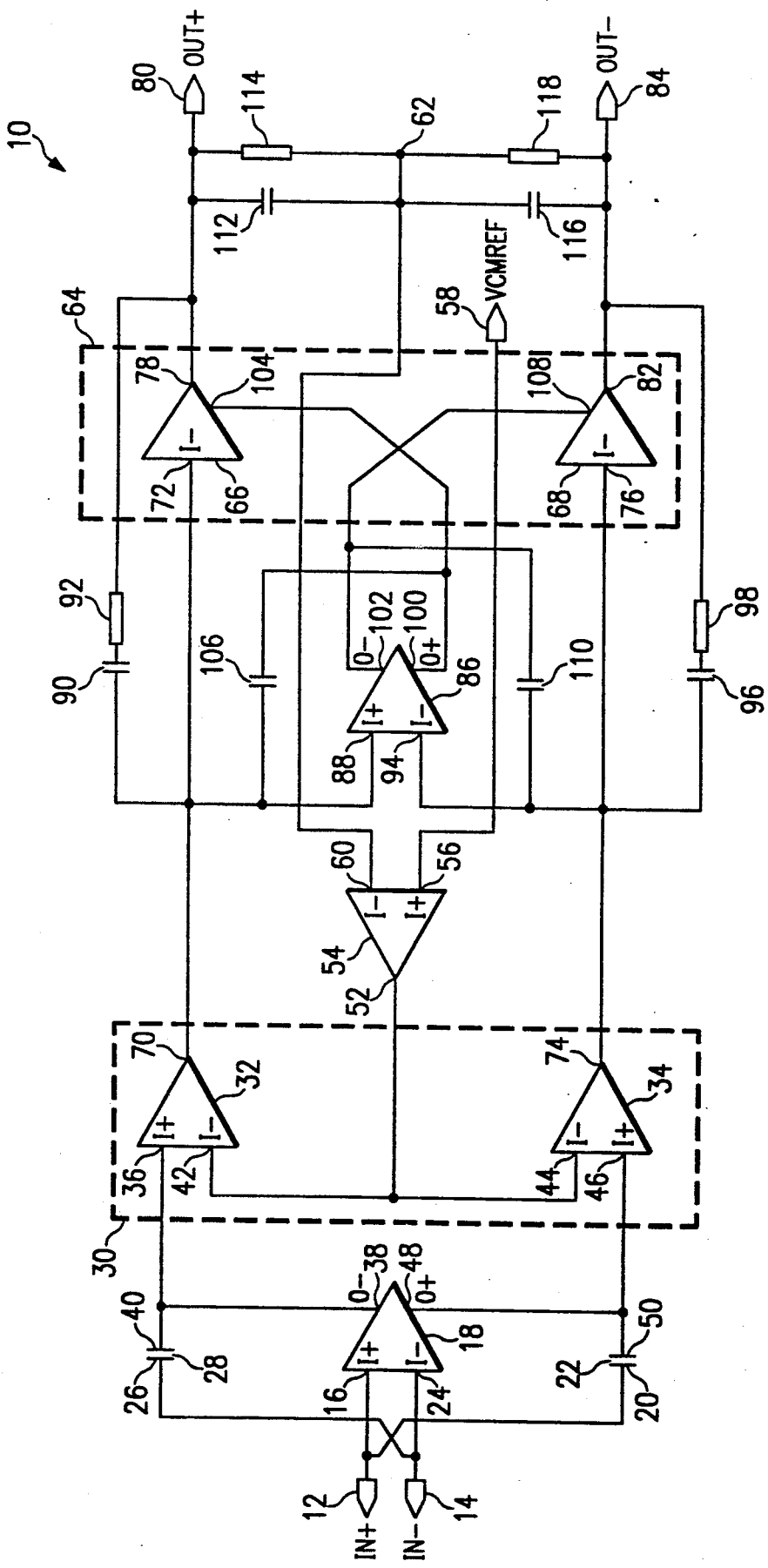
FIG. 1 is a functional block diagram of an operational amplifier according to the present invention.

FIG. 1 is a block diagram of a high performance operational amplifier 10 according to the present invention. Operational amplifier 10 includes a noninverting input 12 and an inverting input 14. Noninverting input 12 is coupled to the noninverting input 16 of first (input) stage 18 and the first plate 20 of capacitor 22. Inverting input 14 is coupled to the inverting input 24 of first (input) stage circuitry 18 and the first plate 26 of capacitor 28.

The second stage of operational amplifier 10 (the first amplifying stage) is a cascode amplifier and is shown generally by dotted lines at 30. Second stage 30 includes an upper section 32 and a lower section 34. The noninverting input 36 of upper section 32 is coupled to the inverting output 38 of input stage 18. Noninverting input 36 is also coupled to second plate 40 of capacitor 28. The inverting input 42 of section 32 is coupled to the inverting input 44 of lower section 34. The noninverting input 46 of lower section 34 is coupled to the noninverting output of input stage 18 and second plate 50 of capacitor 22.

Inverting input 42 of upper stage 32 and inverting input 44 of lower stage 34 are each connected to output 52 of third stage 54. The noninverting input of third stage 54 is coupled to a reference voltage $V_{cmref}$ at node 58. The inverting input of third stage 54 is coupled to node 62. Third stage 54 operates as the input stage of a common mode loop which sets the operating point of amplifier 10 by maintaining the mean output voltage of amplifier 10 at a preselected common mode voltage.

The fourth stage (the second amplifying stage) is shown by dotted lines generally at 64 and includes an upper section 66 and a lower section 68. The output 70 of upper section 32 of second stage 30 is coupled to inverting input 72 of upper section 66 of fourth stage 64. The output 74 of lower section 34 of second stage 30 is coupled to inverting input 76 of lower section 68 of fourth stage 64. The output 78 of upper section 66 is coupled to noninverting output 80 of amplifier 10 while the output 82 of lower section 68 is coupled to inverting output 84 of amplifier 10.

Output current is dynamically controlled with a loop including fifth stage 86 (the auxiliary stage). Output 70 of upper section 32 of second stage 30 is coupled to noninverting input 88 of fifth stage 86. Output 74 of lower section 34 of second stage 30 is coupled to inverting input 94 of fifth stage 86.

Output signals appearing on output terminals 80 and 84 are also fed back to a fifth stage 86. Noninverting output terminal 80 is coupled to noninverting input 88 of fifth stage 86 through a capacitor 90 and resistor 92. Similarly, inverting output terminal 84 is coupled to inverting input 94 of fifth stage 86 through a capacitor 96 and a resistor 98.

Fifth stage 86 includes a noninverting output 100 and an inverting output 102. Noninverting output 100 is coupled to an input 104 of upper section of fourth stage 64. A capacitor 106 couples noninverting output 100 to inverting input 88 of fifth stage 86. Noninverting output 102 is coupled to an input 108 of lower section 68 of fourth stage 64. A feedback capacitor 110 couples inverting output 102 of fifth stage 86 to inverting input 94.

In the preferred embodiment, noninverting output terminal 80 of amplifier 10 is coupled to node 62 and the input 60 of third stage 54 by a parallel combination of capacitor 112 and resistor 114. Similarly, inverting output terminal 84 is coupled through node 62 and input 60 of third stage 54 by the parallel combination of capacitor 116 and resistor 118.

In the preferred embodiment, input stage 18 comprises a differential amplifier at inputs 16 and 24 of input stage 18 such that the receipt of unbalanced differential signals results in similarly unbalanced output signals appearing on inverting output 38 and noninverting output 48. The amplified differential signals output from each output of input stage 18 are then fed to the respective noninverting inputs 36 and 46 of amplification sections 32 and 34 of the first amplifying stage 30. In the preferred embodiment, amplification sections 32 and 34 comprise cascode amplification stages whose outputs are driven from first and second voltage rails. The respective differential signals are then further amplified through second stage amplification sections 66 and 68. In the preferred embodiment, amplification sections 66 and 68 comprise common source amplifiers whose outputs are also driven from the first and second voltage rails. Amplifier sections 66 and 68 invert the polarities of the differential signals, which had been previously inverted by the differential amplifier of input stage 18, such that the outputs at 80 and 84 directly correspond in polarity to the inputs at input terminals 12 and 14. The double amplification stage provides increased output drive allowing a greater voltage swing across the load coupled between output terminals 80 and 84.

Auxiliary section 86 controls the bias currents at the outputs of second stage amplification sections 66 and 68. In the preferred embodiment, auxiliary stage 86 includes current mirrors coupled at inputs 104 and 108 of respective amplification sections 66 and 68. Functionally, the current mirrors mirror the current through the common source amplifier output transistors. Auxiliary section 86 also includes a differential amplifier which drives the current mirrors received from the outputs 70 and 74 of the first amplification sections 32 and 34. When the outputs 70 and 74 of amplification sections 32 and 34 are unbalanced the signal provided to inputs 88 and 94 of the differential amplifier of auxiliary stage 86 causes unbalanced drive to the current mirrors. The resulting unbalanced current through the current mirrors is in turn reflected in an unbalanced current output from common source amplification sections 66 and 68. The resulting modulation of the output current allows the circuit to adapt to the current required by the output load, thereby increasing the threshold beyond which the amplifier goes into the slew rate mode.

The operating point of amplifier 10 is set by maintaining the mean voltage value between output terminals 80 and 84 at the common mode voltage. In the preferred embodiment, the mean of the output voltages is taken at node 62 which is coupled to noninverting output terminal 80 through an impedance comprising capacitor 112 and resistor 114 and to inverting output 84 through the impedance comprising capacitor 116 and resistor 118. The mean voltage appearing at node 62 is then fed back to the inverting input of common mode stage 54, the noninverting input 56 of which is tied to a reference voltage $V_{cmref}$. In the preferred embodiment, common mode stage 54 comprises a differential amplifier with inputs 56 and 60 being its respective differential inputs. The reference voltage controls the balancing of the differential amplifier in essence comparing the reference voltage with the mean output voltage. The output of common mode section 54 then provides feedback at the inverting inputs 42 and 44 of first stage amplifying sections 32 and 34 such that the cascode amplifiers making up sections 32 and 34 are biased to set the common mode voltage of outputs 80 and 84.

Figure 2:
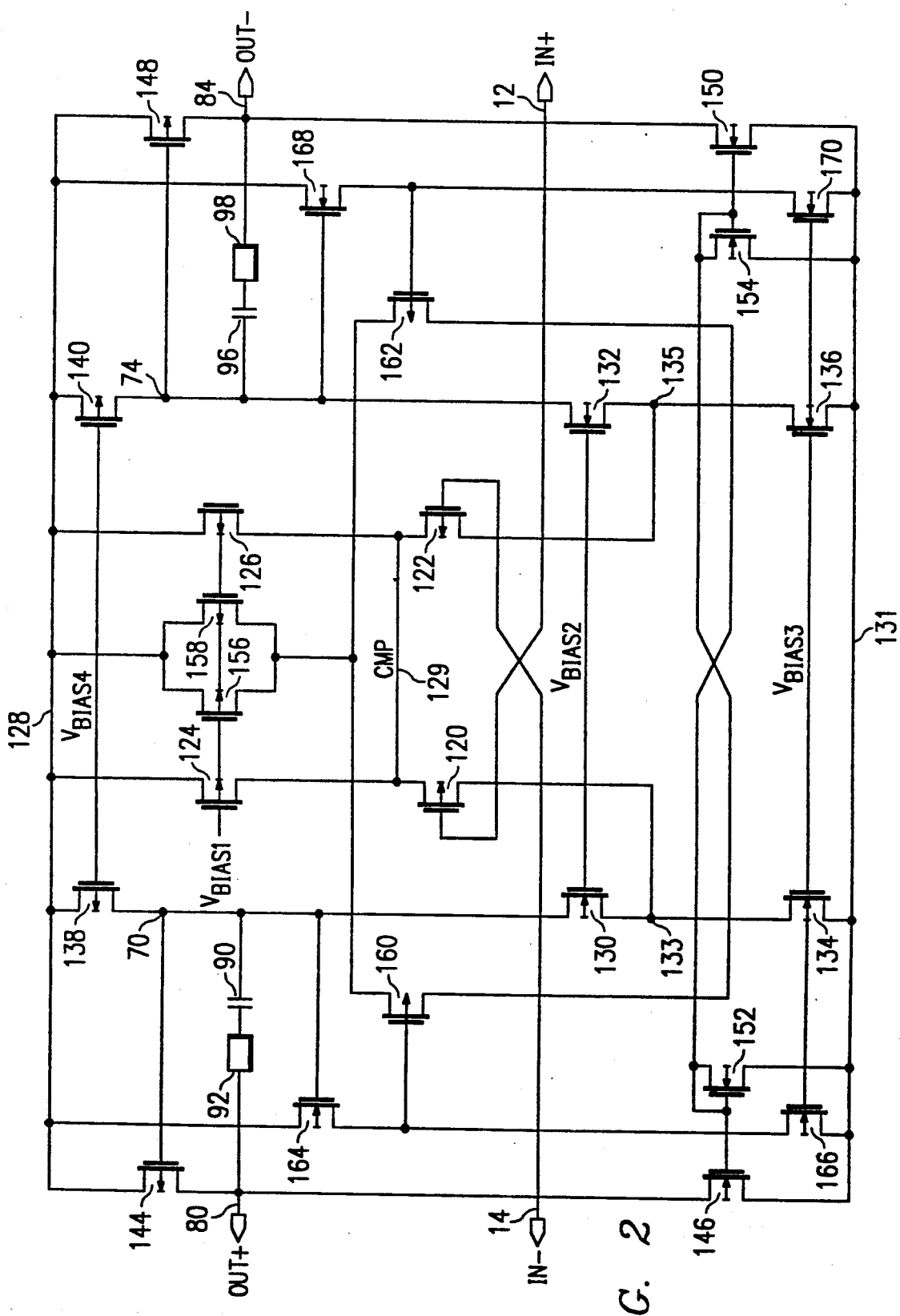
FIG. 2 is an electrical schematic diagram of the differential path portion of the operational amplifier according to the present invention.

Referring next to FIG. 2, a schematic diagram depicts the differential path of operational amplifier 10. The differential path includes first stage (the input stage) 18, second stage (the first gain stage) 30, fourth stage (the second gain stage) 64 and stage five 86 which dynamically controls the bias current of fourth stage 64.

First stage 18 is composed of a pair of differential p channel transistors 120 and 122, and a current source made up of transistors 124 and 126. Noninverting input terminal 12 of amplifier 10 is coupled to the gate of transistor 120, which is noninverting input 16 for input stage 18. Inverting terminal 14 is similarly tied to the gate of transistor 122 Which is the noninverting input 24 of input stage 18. One source/drain of transistor 120 is coupled to a first source/drain of current p channel source transistor 124. The second source/drain of p channel transistor 124 is coupled to first voltage rail 128 while the gate of transistor 124 is coupled to a bias voltage $V_{bias1}$. Similarly, a first one of the source/drain of transistor 122 is coupled to the first source/drain of transistor 126. The second source/drain region of transistor 126 is coupled to voltage rail 128 while the gate of transistor 126 is coupled to bias voltage $V_{bias1}$. The first source/drains of differential transistors 120 and 122, and current source transistors 124 and 126 are tied together by conductor 129.

The second stage 30 (the first gain stage) includes a cascode amplifier made up of n channel transistors 130, 132, 134 and 136, and p channel transistors 138 and 140. The current flowing out of p channel transistor 120 of the first stage 16 modulates the current flowing through the cascode stage consisting of n channel transistors 130 and 134 and the p channel cascode load transistor 138. The second source/drain of p channel transistor 120 is coupled to respective first source/drains of n channel transistors 130 and 134 at node 133. The second source/drain of transistor 130 is coupled to the first source/drain of p channel transistor 138. The gate of transistor 130 is tied to bias voltage $V_{bias2}$. The second source/drain of n channel transistor 134 is tied to the second Voltage rail 131. The gate of transistor 134 is tied to bias voltage $V_{bias3}$. The second source/drain of p channel transistor 138 is coupled to first voltage rail 128 while the gate of transistor 138 is coupled to bias Voltage $V_{bias4}$.

The current through p channel transistor 122 modulates the current flowing through the cascode stage including n channel transistors 132 and 136 and p channel load transistor 140 The second source/drain of transistor 122 is coupled to the first source/drains of n channel transistors 132 and 136, respectively at node 135. The second source/drain of transistor 132 is coupled to the first source/drain of transistor 140 while the gate of transistor 132 is coupled to bias voltage $V_{bias2}$. The second source/drain of n channel transistor 136 is tied to the second voltage rail 131 while the gate of transistor 136 is coupled to bias voltage $V_{bias3}$. Finally, the second source/drain of p channel transistor 140 is tied to first voltage rail 128 and the gate of transistor 140 is coupled to bias voltage $V_{bias4}$.

It is important to note that the structure used for the circuitry of second stage 30 allows for the selection of large sized transistors 134 and 136 which reduces their contributions to noise and offset without reducing the performance of the amplifier.

The upper section 66 of fourth stage 64 (the second gain stage) is composed of p channel transistor 144 and n channel transistor 146 The first source/drain regions of transistors 144 and 146 are tied together and to noninverting output 80. The second source/drain of p channel transistor 144 is coupled to first voltage rail 128. The gate of transistor 144 is coupled to the second source/drain of transistor 130, forming part of second stage 30, at node 70. The second source/drain of n channel 146 is coupled to second voltage rail 131.

The lower section 68 of fourth stage 64 includes p channel transistor 148 and n channel transistor 150. The respective first source/drains of transistors 148 and 150 are coupled together and coupled to inverting output 84 of amplifier 10. The second source/drain of transistor 148 is coupled to first voltage rail 128 while the gate of transistor 148 is coupled to the second source/drain of transistor 132, forming part of second stage 30, at node 74. The second source/drain of transistor 150 is coupled to second voltage rail 131.

The biasing current of the fourth stage 64 is controlled by fifth (auxiliary) stage 86 which allows dynamic adaptation of the current to the differential signal output on terminals 80 and 84. A first current mirror is formed by coupling the gate of transistor 146 to the gate and first source/drain of n channel transistor 152. The second source/drain of transistor 152 is coupled to the second voltage rail 131. A second current mirror is formed by coupling the gate of n channel transistor 150 to the gate and first source/drain of n channel transistor 154. The second source/drain of n channel transistor 154 is coupled to second voltage rail 131.

The current biasing for the first and second current mirrors is provided by p channel transistors 156 and 158. p channel transistors 156 and 158 are further coupled to p channel differential pair transistors 160 and 162, which along with transistors 152 and 154, complete the auxiliary differential amplifier. The first source/drain of n channel transistor 152 is coupled to a first source/drain of transistor 162. The second source/drain of transistor 162 is coupled to the first source/drains of p channel transistors 156 and 158. The second source/drains of p channel transistors 156 and 158 are coupled to first voltage rail 128 while the gates of transistors 156 and 158 are tied to bias voltage $V_{bias1}$. In a similar fashion, the first source/drain of n channel transistor 154 is coupled to a first source/drain of p channel transistor 160. The second source/drain of p channel transistor 160 is also coupled both to the first source/drains of p channel transistors 156 and 158.

A pair of voltage followers are formed by transistors 164 and 166, 168 and 170. The first source/drains of transistors 164 and 166 are coupled together and to the gate of p channel transistor 160. The second source/drain of n channel transistor 164 is coupled to the first voltage rail 128 While the second source/drain of transistor 166 is tied to second voltage rail 131. The gate of transistor 164 is coupled to node 70 and the gate of n channel transistor 166 is tied to bias voltage $V_{bias3}$. Similarly, the first source/drains of n channel transistors 168 and 170 are coupled together and to the gate of p channel transistor 162. The second source/drain of transistor 168 is tied to first voltage rail 128 while the second source/drain of transistor 170 is tied to second voltage rail 131. The gate of transistor 168 is tied to node 74 while the gate of transistor 170 is tied to bias voltage $V_{bias3}$.

Noninverting output terminal 80 is coupled to node 70 through capacitor 90 and resistor 92. Inverting output 84 is coupled to node 74 through capacitor 96 and resistor 98.

When no differential signal appears between the gates of transistors 160 and 162, the currents flowing through transistors 152 and 154 are equal. Since the currents flowing through transistors 146 and 150 are respective images of the currents flowing in transistors 152 and 154, the biasing currents at the output terminals 80 and 84 are equal. When a differential signal is applied between the gates of transistors 160 and 162, however, a voltage difference is created at nodes 70 and 74 of second stage 30. The voltage difference appearing at nodes 70 and 74 drive the gates of differential transistors 160 and 162 through the voltage followers formed by transistors 164 and 166 and 168 and 170, respectively. Transistors 160 and 162 drive transistors 152 and 154 differentially (unbalanced) such that the output currents through transistors 146 and 150 are unequal. This modulation of output current provides for the adaptation of the currents at output terminals 80 and 84 to the associated loads. This increases the threshold beyond which the amplifier goes into the slew rate mode and consequently reduces the non-linearities resulting due to the slew rate phenomenon during transients.

Figure 3:
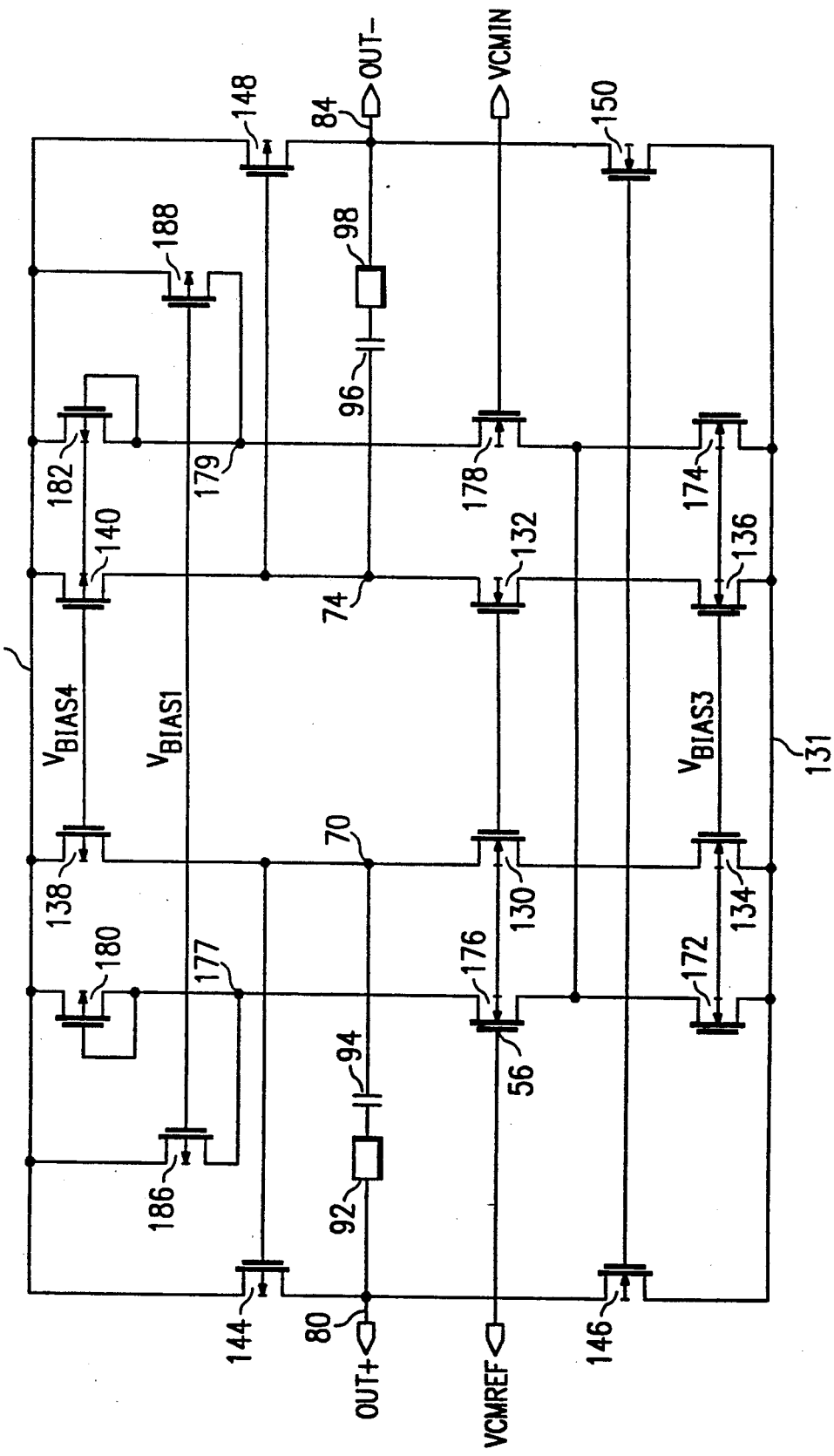
FIG. 3 is an electrical schematic diagram of the common mode path portion of the operational amplifier according to the present invention.

Referring next to FIG. 3, the common mode path for operational amplifier 10 is depicted. For the sake of brevity and clarity, interconnections previously described in conjunction with the differential path shown in FIG. 2 will not be repeated here.

The input stage for the common mode path includes a current source consisting of n channel transistors 172 and 174, a differential pair formed by n channel transistors 176 and 178, and loads consisting of p channel transistors 180 and 182. The first source/drains of transistors 172 and 174 are tied to second voltage rail 131 while the gates of transistors 172 and 174 are coupled to bias voltage $V_{bias3}$. The second source/drain of transistor 172 is coupled to a first source/drain of transistor 176 while the second source/drain of transistor 174 is tied to a first source/drain of transistor 178. The gate of transistor 176 is tied to a reference common mode voltage $V_{cmref}$. The gate of transistor 178 is coupled to a signal $V_{cmin}$, which is equal to the mean value of the two output voltages appearing at output terminals 80 and 84. This mean value can be generated either in a time continuous fashion using resistors 114 and 118, as depicted in FIG. 1, or in a sampled way by replacing resistors 114 and 118 with switched capacitors. The second source/drain of transistor 176 is coupled to the gate and first source/drain of transistor 180 at node 177. The second source/drain of transistor 180 is in turn tied to first voltage rail 128. The second source/drain of transistor 178 is coupled at node 179 to the gate and first source/drain of p channel transistor 182, the second source/drain of which is tied to voltage rail 128.

An additional pair of p channel current source transistors 186 and 188 are provided. P channel transistor 186 has a first source/drain tied to first voltage rail 128 and a second source/drain coupled to second source/drain of n channel transistor 176. P channel transistor 188 has a first source/drain tied to first voltage rail 128 and a second source/drain coupled to the second source/drain of n channel transistor 178. The gates of transistors 186 and 188 are each tied to bias voltage $V_{bias1}$.

As previously discussed, the common mode path sets the common mode voltage and thereby the operating point of operational amplifier 10. The structure of the common mode path is also designed to avoid any locking state and ensure the proper biasing at start-up of the circuit independent of the initial conditions.

Figure 4:
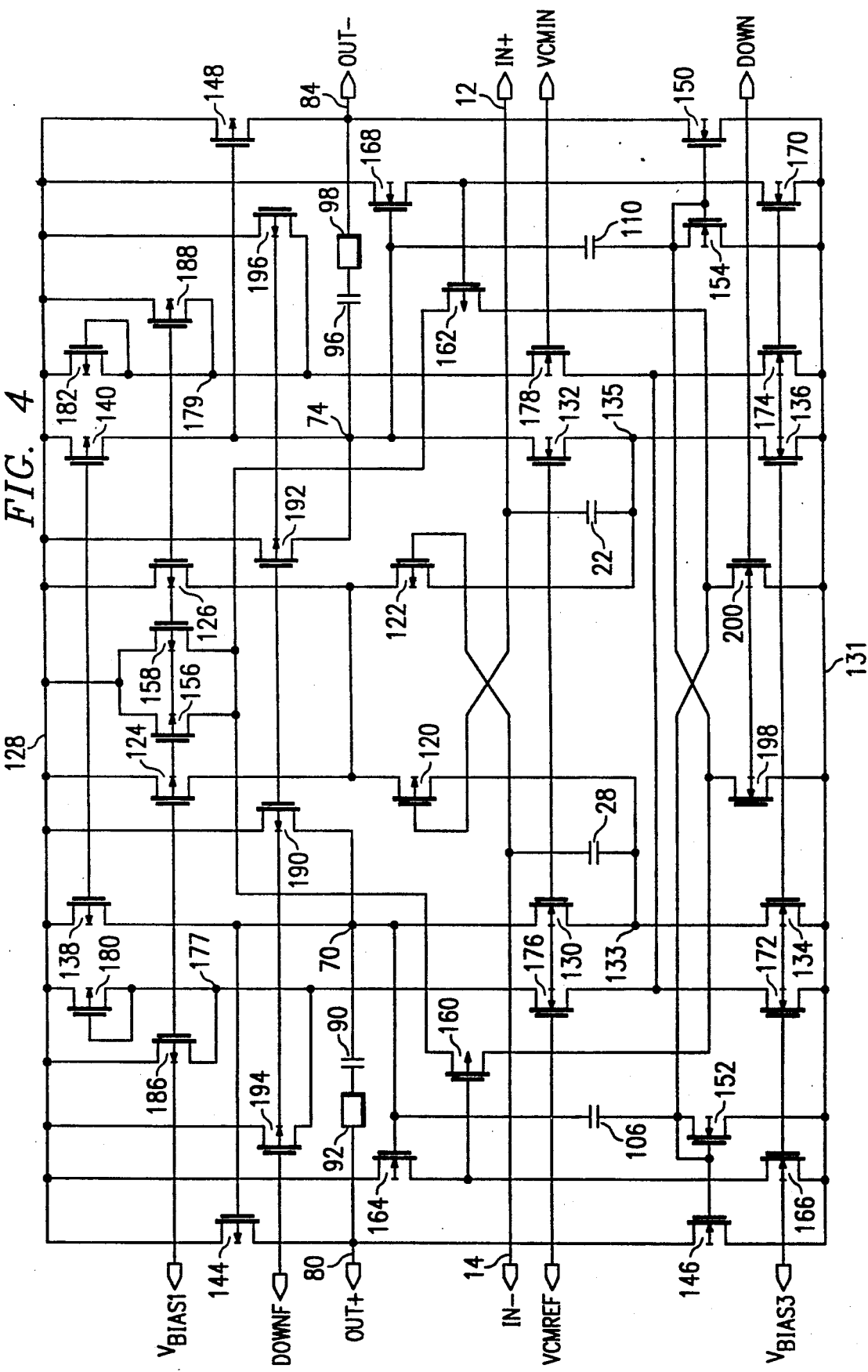
FIG. 4 is an electrical schematic diagram of the operational amplifier according to the present invention.

FIG. 4 is a schematic diagram of the complete circuitry of operational amplifier 10, including the compensation loops, as well as the differential and common mode paths depicted in FIGS. 2 and 3. Overall loop stability is achieved by compensation networks, one of which is the main network used for the compensation of both the differential and common mode paths. The main compensation network uses the pole-splitting technique and includes the RC networks formed by capacitor 90 and resistor 92, and capacitor 96 and resistor 98, respectively. The main pole location depends on the output conductance of transistors 138 and 140, on the values of capacitors 90 and 96, and on the gain of the output stages formed by transistors 144, 146, 148 and 150. Since all the elements required to set the main pole location are shared by both the differential and common mode paths, the same compensation network ensures the stability of the two loops.

Since, in essence, the only difference between the differential and common mode loops is their input stages, an adjustment in the gain of the input stage for the common mode loop is made so that the frequency characteristics of the differential and common mode loops are similar and such that the same values for the discrete elements of the compensation network will compensate both loops. This adjustment is done by selecting the size of transistors 186 and 188 which sets the transconductance of the input differential pair transistors 176 and 178 of the common mode amplifier.

Feed forward type secondary compensation is also provided. Capacitors 22 and 28 allow compensation of the pole due to the parasitic capacitance on the cascode nodes 133 and 135 when the transconductance ratio of transistors 120 and 130 and 122 and 132 are properly selected. Capacitors 106 and 110 are used as feed-forward elements for the fifth stage 54.

The power-down state is set by opening all the paths allowing current flow between supply rails 128 and 131. This is achieved by turning off most of the active devices and setting values of the internal nodes to a known voltage. This function is implemented using p channel transistors 190, 192, 194 and 196, and n channel 1 transistors 198 and 200. The gates of p channel 1 transistors 190, 192, 194, and 196 are each tied to a signal DOWNF. First ones of the source/drains of p channel transistors 190, 192, 194, 196 are each tied to first voltage rail 128. The second source/drain of transistor 190 is coupled to node 70 while the second source/drain of transistor 192 is connected to node 74. In a similar fashion, the second source/drain of p channel transistor 194 is tied to node 177 while the second source/drain of transistor 196 is tied to node 179. The gates of n channel transistors 198 and 200 are each tied to signal DOWN. First ones of the source/drains of transistors 198 and 200 are coupled to second Voltage rail 131. The second one of the source/drains of transistor 198 is coupled to the first source/drain of p channel transistor 100 while the second source/drain of n channel transistor 200 is coupled to the first source/drain of transistor 162.

During power down, bias voltage $V_{bias1}$ is set to the high supply voltage and bias voltage $V_{bias3}$ to the low voltage supply. This turns off p channel current source transistors 124, 126, 186, and 188 and n channel current source transistors 134, 136, 172, 174, 166 and 170. The signal DOWNF is set to the low supply voltage and switches on p channel transistors 190, 192, 194 and 196 thereby forcing nodes 70, 74, 177 and 179 to the high voltage supply and turning off p channel output devices 148 and 144. At the same time, the signal DOWN is set to the high supply voltage and switches on transistors 198 and 200 and turns off output current source transistors 146 and 150.

In the preferred embodiment, the voltages supplied to the rails 128 and 131 are selected to be on the order of +5 volts and −0 volts, respectively for compatibility with the associated digital circuitry. The bias voltages $V_{bias}$ and the voltages of signals DOWNF and DOWN are then selected accordingly. The operational amplifier of the present invention will provide typically unity gain bandwidth greater than 30 MHz, low frequency gain greater than 70 dB and an output dynamic range of 8 volts peak to peak with linearity greater than 80 dB. Moreover, the operational amplifier of the present invention will drive both resistive loads (typically 20K ohms) and capacitive loads (typically 5 pF). Further, the slew rate mode is avoided during switching transients. Finally, the present invention provides a switchable power-down mode and an unlockable common mode control loop at power up.

While preferred embodiments of the invention and their advantages have been set forth in the above-detailed description, the invention is not limited thereto, but only by the scope and spirit of the appended claims.

What is claimed is:

1. An operational amplifier comprising:
   a differential input for receiving first and second differential input signals;
   a first gain stage coupled to said differential input for amplifying said differential signals;
   a second gain stage coupled to said first gain stage for further amplifying said differential signals;
   first and second outputs connected to said second gain stage for outputting said amplified differential signals;
   a common mode stage for comparing a common mode voltage appearing between said first and second outputs with a reference voltage and outputting common mode control signals in response to the comparison to said first gain stage; and
   an auxiliary stage for dynamically controlling the output bias current provided from said second gain stage in response to amplified differential signals appearing at said first and second outputs.

2. The operational amplifier of claim 1, wherein said first and second gain stages each comprise first and second amplification sections.

3. The operational amplifier of claim 1, wherein said common mode stage includes a differential amplifier.

4. The operational amplifier of claim 1, wherein said auxiliary stage includes a differential amplifier.

5. An operational amplifier comprising:
   differential input circuitry for receiving first and second differential signals;
   first gain circuitry coupled to said input circuitry, said first gain circuitry having a first section for amplifying said first differential signal and a second section for amplifying said second differential signal;
   second gain circuitry coupled to said first circuitry, said second gain circuitry having a first section for further amplifying said first differential signal and a second section for further amplifying said second differential signal;
   a first output terminal coupled to said second gain circuitry for outputting a first amplified differential signal;
   a second output terminal coupled to said second gain circuitry for outputting a second amplified differential signal;
   common mode circuitry coupling said first gain circuit with said first and second output terminals for setting the operating point of said operational amplifier; and
   auxiliary circuitry coupled to said second gain circuitry and to said first and second output terminals for dynamically controlling the output bias current provided from said second gain circuitry at said first and second output terminals.

6. The operational amplifier of claim 5, wherein said differential input circuitry comprises a differential amplifier.

7. The operational amplifier of claim 5, wherein said first gain circuitry comprises a cascode amplifier.

8. The operational amplifier of claim 5, wherein said second gain circuitry comprises first and second common source amplifiers.

9. The operational amplifier of claim 5, wherein said common mode circuitry maintains the mean value of a differential voltage appearing between said first and second output terminals at a preselected common mode voltage.

10. The operational amplifier of claim 9, wherein said common mode circuitry includes a first input and a second input, said first input coupled to said first output terminal through a first impedance and to said second output terminal through a second impedance, said second input coupled to a reference voltage.

11. The operational amplifier of claim 5, wherein said auxiliary circuitry comprises a first current mirror coupled to said first output terminal, a second current mirror coupled to said second output terminal, and a differential amplifier coupled to said first and second current mirrors for driving said first and second current mirrors.

12. A high performance operational amplifier comprising:
   an input stage having a noninverting input and an inverting input;
   a first gain stage having first and second amplification sections, a noninverting input of said first section coupled to an inverting output of said input stage and a noninverting input of said second section coupled to a noninverting output of said input stage;
   a second gain stage having first and second amplification sections, an inverting input of said first section of said second gain stage coupled to an output of said first section of said first gain stage, an inverting input of said second section of said second gain stage coupled to an output of said second section of said first gain stage;
   a first output terminal coupled to said first section of said second gain stage for outputting a first amplified differential signal;
   a second output terminal coupled to said second section of said second gain stage for outputting a second amplified differential signal;
   a common mode input stage having a noninverting input coupled to a reference voltage and an inverting input coupled to an output of said first section of said second gain stage through a first impedance and to an output of said second section of said second gain stage through a second impedance, said common mode input stage further having an output coupled to respective inverting inputs of said first and second sections of said first gain stage; and
   an auxiliary stage having a noninverting input coupled to said output of said first section of said first gain stage and an inverting input coupled to said output of said second section of said first gain stage, a noninverting output of said auxiliary stage coupled to a second input of said first section of said second gain stage and an inverting output of said auxiliary stage coupled to a second input of said second section of said second gain stage.

13. The operational amplifier of claim 12, and further comprising a split pole compensation network having a first resistor-capacitor network coupling said output of said first section of said second gain stage to said noninverting input of said auxiliary stage and a second resistor-capacitor network coupling said output of said second section of said second gain stage to said inverting input of said auxiliary stage.

14. The operational amplifier of claim 12, wherein said input stage comprises a differential amplifier including first and second differential transistors and a current source.

15. The operational amplifier of claim 12, wherein said first and second sections of said first gain stage comprise first and second cascode amplifier sections each having a cascode transistor coupled through a load transistor to a first voltage supply and through a current source transistor to a second voltage supply.

16. The operational amplifier of claim 12, wherein said first and second sections of said second gain stage comprise first and second common source amplifier sections, said first common source amplifier section having a common source amplifying transistor coupling said first output terminal to a first voltage supply and a load transistor coupling said first output terminal to a second voltage supply, said second common source amplifier section having a common source amplifying transistor coupling said second output terminal to said first voltage supply and a load transistor coupling said second output terminal to said second voltage supply.

17. The operational amplifier of claim 12, wherein said auxiliary stage comprises:
   a noninverting first current mirror coupled to an input of said first section of said second gain stage;
   an inverting second current mirror coupled to an input of said second section of said second gain stage; and
   a differential amplifier for driving said first and second current mirrors.

18. The operational amplifier of claim 12, wherein said common mode input stage comprises a differential amplifier having a current source and first and second differential transistors, said first differential transistor driven by the mean of the voltage appearing across said first and second output terminals, and said second differential transistor driven by a reference voltage.

19. A method for amplifying differential signals comprising the steps of:
   receiving first and second differential signals at the inputs of an input differential amplifier;
   amplifying the first and second differential signals using respective first and second cascode amplifier stages coupled to the input differential amplifier;
   further amplifying the first and second differential signals using respective first and second common source amplifier stages coupled to the first and second cascode amplifier stages;
   applying the amplified first and second differential signals output from the first and second common source amplifier stages to the inputs of an auxiliary differential amplifier;
   controlling the output bias currents of the first and second common source amplifier stages using first and second current mirrors driven by the auxiliary differential amplifier;
   comparing the mean value of the voltage appearing between the outputs of the first and second common source amplifier stages using a common mode input differential amplifier; and
   feeding back the output of the common mode input differential amplifier to the first and second cascode amplifier stages to set the common mode voltage.

20. An operational amplifier comprising:
   a differential signal input stage for receiving first and second differential signals;
   a differential loop for amplifying said differential signals, said differential loop including
      a first gain stage coupled to said input stage,
      a second gain stage coupled to said first gain stage,
      first and second output terminals connected to said second gain stage for outputting said amplified differential signals, and
      circuitry coupled to said output terminals and to said second gain stage for dynamically controlling the output bias current of said second gain stage; and
   a common mode loop for maintaining the mean voltage difference between said amplified differential signals at a preselected value at said output terminals.

21. The operational amplifier of claim 20, wherein said common mode loop comprises:
   said first gain stage;
   said second gain stage; and
   a common mode input stage coupling said output terminals and said first gain stage.

22. The operational amplifier of claim 20 and further comprising a pole splitting compensation network coupling said output terminals and said first and second gain stages, said pole splitting network operable to provide differential and common mode compensation.

* * * * *